United States Patent
Linder et al.

(10) Patent No.: US 7,495,249 B2
(45) Date of Patent: Feb. 24, 2009

(54) RADIATION-EMITTING SEMICONDUCTING BODY WITH CONFINEMENT LAYER

(75) Inventors: Norbert Linder, Wenzenbach (DE); Ines Pietzonka, Regensburg (DE)

(73) Assignee: Osram Opto Semiconductors GmbH, Regensburg (DE)

(*) Notice: Subject to any disclaimer, the term of this patent is extended or adjusted under 35 U.S.C. 154(b) by 0 days.

(21) Appl. No.: 10/956,728

(22) Filed: Sep. 30, 2004

(65) Prior Publication Data
US 2005/0074044 A1 Apr. 7, 2005

(30) Foreign Application Priority Data
Sep. 30, 2003 (DE) ............... 103 45 412
Dec. 1, 2003 (DE) ............... 103 55 962

(51) Int. Cl.
*H01L 29/06* (2006.01)
(52) U.S. Cl. .............. 257/13; 257/77; 257/103
(58) Field of Classification Search ......... 257/200, 257/201, 13, 77, 94, 103
See application file for complete search history.

(56) References Cited

U.S. PATENT DOCUMENTS

| | | | |
|---|---|---|---|
| 5,539,239 A * | 7/1996 | Kawazu et al. ......... | 257/94 |
| 5,732,099 A * | 3/1998 | Kawasumi et al. ...... | 372/46.012 |
| 6,046,464 A * | 4/2000 | Schetzina ............... | 257/96 |
| 6,222,203 B1 * | 4/2001 | Ishibashi et al. ........ | 257/88 |
| 6,462,354 B1 * | 10/2002 | Okuyama ................ | 257/13 |
| 6,472,679 B1 | 10/2002 | Takayama et al. | |
| 6,525,335 B1 * | 2/2003 | Krames et al. .......... | 257/13 |
| 6,586,779 B2 | 7/2003 | Tsuda et al. | |
| 6,611,003 B1 * | 8/2003 | Hatakoshi et al. ....... | 257/98 |
| 6,858,882 B2 * | 2/2005 | Tsuda et al. ............ | 257/103 |
| 2004/0090779 A1 * | 5/2004 | Ou et al. ................ | 362/231 |

FOREIGN PATENT DOCUMENTS

| | | |
|---|---|---|
| JP | 07115243 A | 5/1995 |
| JP | 2000183399 A | 6/2000 |

OTHER PUBLICATIONS

Xu Z., "Solid-liquid equilibria for III-V quinary alloy semiconductors"1997,Solid state communications, vol. 103, No. 7, pp. 417-420.*

Chang, S.J. et al., "642-nm AlGaInP Laser Diodes with a Triple Tensile Strain Barrier Cladding Layer", May 1998, IEEE Photonics Technology Letters, vol. 10, No. 5, pp. 651-653.

* cited by examiner

*Primary Examiner*—Long Pham
(74) *Attorney, Agent, or Firm*—Fish & Richardson P.C.

(57) ABSTRACT

A radiation-emitting semiconductor with a radiation-emitting active layer having $In_xAl_yGa_{1-x-y}P$ ($0 \leq x \leq 1$, $0 \leq y \leq 1$, $0 \leq x+y \leq 1$) is described. The active layer is arranged between a first confinement layer and a second confinement layer. The layers can contain $In_xAl_yGa_{1-x-y}P_uN_{1-u}$ ($0 \leq x \leq 1$, $0 \leq y \leq 1$, $0 \leq x+y \leq 1$ and $0 \leq u < 1$), $B_zIn_xAl_yGa_{1-x-y-z}P_uN_{1-u}$ ($0 \leq x \leq 1$, $0 \leq y \leq 1$, $0 < z \leq 1$, $0 \leq x+y+z \leq 1$ and $0 \leq u < 1$) or a II-VI semiconductor material.

29 Claims, 2 Drawing Sheets

RADIATION-EMITTING SEMICONDUCTING BODY WITH CONFINEMENT LAYER

BACKGROUND

This invention relates to radiation-emitting semiconductors.

Conventional semiconductor devices often have confinement layers of InAlGaP, between which an active layer is arranged. These confinement layers constitute barriers for charge carriers. The confinement layers serve to confine the charge carriers or at least increase their retention period within the active layer.

It is desirable that the charge carriers are as completely confined as possible or that their retention period within the active layer lasts as long as possible. Outside the active layer, charge carriers do not contribute significantly to the production of radiation.

Customarily, confinement layers and active layers are lattice matched, i.e., the adjacent layers have essentially the same lattice constant. An insufficient lattice match bears the possible risk of creating strain between the confinement layer and the active layer, as well as defects in the crystal lattice. Such defects can diminish the radiation effect, since they can favor the non-radiating recombination of charge carriers.

In lattice matched confinement layers of InAlGaP, the maximally achievable barrier height, i.e., the potential energy difference through which a charge carrier would need to travel to escape the active layer, e.g., the difference between the energy levels of the active and confinement layers is relatively low. Typically, the maximum barrier height, is attained with AlInP confinement layers. Because of the limited barrier height leakage currents of charge carriers can occur. Leaked currents of charge carriers do not contribute to the creation of radiation.

A closely related problem of the charge carrier confinement exists in radiation-emitting quantum well structures of InAlGaP. Confinement of the charge carrier here takes place in the quantum well or wells. A quantum well structure of InAlGaP contains multiple subsequent quantum well and barrier layers. As with the confinement layers, a potential problem is the limited height of the barriers in the case of lattice matched layers.

SUMMARY

Radiation-emitting semiconductors using indium gallium aluminum phosphide (InAlGaP) and having improved charge carrier confinement are described.

In one aspect, a radiation-emitting semiconductor is described that has a two confinement layers. Between the confinement layers is a radiation-emitting active layer including $In_xAl_yGa_{1-x-y}P$ ($0 \leq x \leq 1$, $0 \leq y \leq 1$, $0 \leq x+y \leq 1$). At least one of the confinement layers includes one or more of $In_xAl_yGa_{1-x-y}P_uN_{1-u}$ ($0 \leq x \leq 1$, $0 \leq y \leq 1$, $0 \leq x+y \leq 1$ and $0 \leq u < 1$), $B_zIn_xAl_yGa_{1-x-y-z}P_uN_{1-u}$ ($0 \leq x \leq 1$, $0 \leq y \leq 1$, $0 < z \leq 1$, $0 \leq x+y+z \leq 1$ and $0 \leq u < 1$) or a II-VI semiconductor material.

In another aspect, a radiation-emitting semiconductor, including a radiation-emitting active layer is described. The radiation-emitting active layer includes $In_xAl_yGa_{1-x-y}P$ ($0 \leq x \leq 1$, $0 \leq y \leq 1$, $0 \leq x+y \leq 1$) with a quantum well structure having one or more barrier layers. The one or more barrier layers include $In_xAl_yGa_{1-x-y}P_uN_{1-u}$ ($0 \leq x \leq 1$, $0 \leq y \leq 1$, $0 \leq x+y \leq 1$ and $0 \leq u < 1$), $B_zIn_xAl_yGa_{1-x-y-z}P_uN_{1-u}$ ($0 \leq x \leq 1$, $0 \leq y \leq 1$, $0 < z \leq 1$, $0 \leq x+y+z \leq 1$, $0 \leq u < 1$) or a II-VI semiconductor material.

In another aspect, a radiation-emitting semiconductor is described that has a two confinement layers and a radiation-emitting active layer having a quantum well structure. At least one of the confinement layers includes one or more of $In_xAl_yGa_{1-x-y}P_uN_{1-u}$ ($0 \leq x \leq 1$, $0 \leq y \leq 1$, $0 \leq x+y \leq 1$ and $0 \leq u < 1$), $B_zIn_xAl_yGa_{1-x-y-z}P_uN_{1-u}$ ($0 \leq x \leq 1$, $0 \leq y \leq 1$, $0 < z \leq 1$, $0 \leq x+y+z \leq 1$ and $0 \leq u < 1$) or a II-VI semiconductor material. Between the confinement layers is the radiation-emitting active layer. The radiation-emitting active layer includes $In_xAl_yGa_{1-x-y}P$ ($0 \leq x \leq 1$, $0 \leq y \leq 1$, $0 \leq x+y \leq 1$) with a quantum well structure having one or more barrier layers. The one or more barrier layers include $In_xAl_yGa_{1-x-y}P_uN_{1-u}$ ($0 \leq x \leq 1$, $0 \leq y \leq 1$, $0 \leq x+y \leq 1$ and $0 \leq u < 1$), $B_zIn_xAl_yGa_{1-x-y-z}P_uN_{1-u}$ ($0 \leq x \leq 1$, $0 \leq y \leq 1$, $0 < z \leq 1$, $0 \leq x+y+z \leq 1$, $0 \leq u < 1$) or a II-VI semiconductor material.

In any of the described structures, the II-VI semiconductor material can include $Zn_xMg_{1-x}S_ySe_{1-y}$ ($0 \leq x \leq 1$, $0 \leq y \leq 1$), $Zn_xMg_yCd_{1-x-y}S_uSe_{1-u}$ ($0 \leq x \leq 1$, $0 \leq y \leq 1$, $0 \leq x+y \leq 1$, $0 \leq u \leq 1$), $Zn_xMg_yCd_{1-x-y}Te$ ($0 \leq x \leq 1$, $0 \leq y \leq 1$, $0 \leq x+y \leq 1$), $Zn_xMg_yCd_{1-x-y}Se$ ($0 \leq x \leq 1$, $0 \leq y \leq 1$, $0 \leq x+y \leq 1$) or $Zn_xMg_yCd_{1-x-y}S$ ($0 \leq x \leq 1$, $0 \leq y \leq 1$, $0 \leq x+y \leq 1$).

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
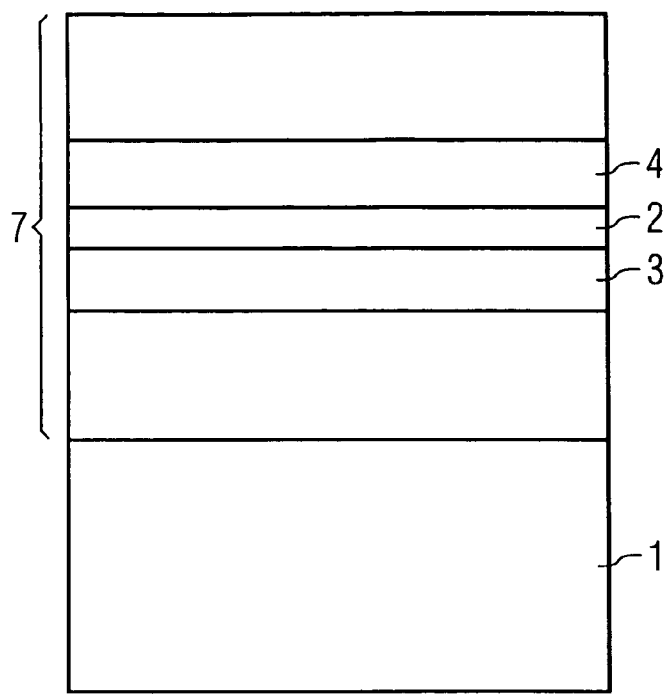
FIG. 1 is a schematic of an example of a semiconductor having confinement layers confining an active layer of InAlGaP.

Semiconductor bodies having active layers and confinement layers containing InAlGaP are described.

In a first implementation, a radiation-emitting semiconductor has a radiation-emitting active layer of $In_xAl_yGa_{1-x-y}P$ $0 \leq x \leq 1$, $0 \leq y \leq 1$, $0 \leq x+y \leq 1$) (indium aluminum gallium phosphide, InAlGaP). The radiation layer is arranged between first and second confinement layers. At least one of the confinement layers includes $In_xAl_yGa_{1-x-y}P_uN_{1-u}$ ($0 \leq x \leq 1$, $0 \leq y \leq 1$, $0 \leq x+y \leq 1$, and $0 \leq u < 1$) (indium aluminum gallium phosphorus nitride, InAlGaPN), $B_2In_xAl_yGa_{1-x-y-z}P_uN_{1-u}$ ($0 \leq x \leq 1$, $0 \leq y \leq 1$, $0 < z \leq 1$, $0 \leq x+y+z \leq 1$, and $0 \leq u < 1$) (boron indium aluminum gallium phosphorus nitride, BInAlGaPN), or a II-VI semiconductor material. The II-VI semiconductor material can be $Zn_xMg_{1-x}S_ySe_{1-y}$ ($0 \leq x \leq 1$, $0 \leq y \leq 1$) (zinc magnesium silicon selenide, ZnMgSSe), $Zn_xMg_yCd_{1-x-y}S_uSe_{1-u}$ ($0 \leq x \leq 1$, $0 \leq y \leq 1$, $0 \leq x+y \leq 1$, $0 \leq u \leq 1$) (zinc magnesium cadmium silicon selenide, ZnMgCdSSe), $Zn_xMg_yCd_{1-x-y}Te$ ($0 \leq x \leq 1$, $0 \leq y \leq 1$, $0 \leq x+y \leq 1$) (zinc magnesium cadmium telluride, ZnMgCdTe), $Zn_xMg_yCd_{1-x-y}Se$ ($0 \leq x \leq 1$, $0 \leq y \leq 1$, $0 \leq x+y \leq 1$) (zinc magnesium cadmium selenide, ZnMgCdSe) and $Zn_xMg_yCd_{1-x-y}S$ ($0 \leq x \leq 1$, $0 \leq y \leq 1$, $0 \leq x+y \leq 1$) (zinc magnesium cadmium silicide, ZnMgCdS). Other II-VI semiconductor materials can also be suitable for the confinement layers, such as wide band gap semiconductors. At least one of the confinement layers can contain a quaternary compound, i.e., a compound with four elements, where x>0, y>0, and x+y<1. The confinement layers can also include a quinary compound with the value u >0. The first and second confinement layers can have the same composition.

With the materials described, i.e., InAlGaPN, BInAlGaPN, or a II-VI semiconductor material, a confinement layer can be constructed for an active layer of InAlGaP that has a greater baffler height than an InAlGaP confinement layer or an AlInP confinement layer. This can result in an efficient confinement of the charge carriers or, to a particularly low leakage current.

The confinement layer or confinement layers can be lattice matched. Two adjacent semiconductor layers having a crystal lattice with essentially the same lattice constant are lattice matched. Lattice matching can prevent defects between layers. Mismatched lattices can induce stress in the semiconductor layers. With the materials mentioned, the confinement layers can have a greater barrier height, while at the same time can be lattice matched to the active layer.

However, lattice matching of the confinement layers may not be necessary. Because of the potentially greater barrier height of the confinement layers, lattice matching can be dispensed with and the possible resulting, usually tensile, strain between the active layer and the confinement layers, can be tolerated. An increase of the radiation effect can be attained in this case nonetheless, i.e., the strain induced losses are compensated by the improved confinement of the charge carriers.

In one variation of the implementation, the first and/or second confinement layers are arranged at a distance from the active layer such that the distance is smaller than the diffusion length. The diffusion length is the measure for the spatial location area of the charge carrier during its average lifetime. In this manner, the largest possible portion of the charge carriers injected into the active layer can be contained by the confinement layers. Thus, locating confinement layers a distance from the active layer that is less than the diffusion length can further increase the radiation efficiency.

In a second implementation, a radiation-emitting semiconductor has a radiation-emitting active layer including $In_xAl_yGa_{1-x-y}P$ ($0 \leq x \leq 1$, $0 \leq y \leq 1$, $0 \leq x+y \leq 1$) with a quantum well structure having one or more barrier layers. At least one of the barrier layers contains $In_xAl_yGa_{1-x-y}P_uN_{1-u}$ ($0 \leq x \leq 1$, $0 \leq y \leq 1$, $0 \leq x+y \leq 1$, and $0 \leq u < 1$), $B_zIn_xAl_yGa_{1-x-y-z}P_uN_{1-u}$ ($0 \leq x \leq 1$, $0 \leq y \leq 1$, $0 < z \leq 1$, $0 \leq x+y+z \leq 1$ and $0 \leq u < 1$) or a II-VI semiconductor material.

Again, with the materials InAlGaPN and BInAlGaPN, or a II-VI semiconductor material, such as ZnMgSSe, ZnMgCdSSe, ZnMgCdTe or ZnMgCdS, in the active layer, a greater barrier height can be achieved than with InAlGaP barrier layers. Thus, a more efficientconfinement of the charge carriers can be achieved. Here, the confinement is in the individualquantum wells within the active layer.

As in the first implementation, with regard to an efficient charge carrier confinement, the quantum well or quantum wells can be enclosed on both sides with barrier layers that contain InAlGaPN, BInAlGaPN, or a II-VI semiconductor material.

In a third implementation, a radiation-emitting semiconductor includes an active layer having a quantum well structure that is enclosed on one or both sides by confinement layers. In this implementation, both the barrier layer or barrier layers of the quantum well structure in the active layer and at least one, or both, confinement layers contain InAlGaPN, BInAlGaPN, or a II-VI semiconductor material, such as ZnMgSSe, ZnMgCdSSe, ZnMgCdTe or ZnMgCdS. The barrier layers and the active layer can be of the same composition.

Referring to FIG. 1, a semiconductor body according to the first implementation described above has a substrate 1 with a series of semiconductor layers 7. The series of semiconductor layers 7 can form an LED structure.

The series of semiconductor layers 7 comprises a radiation-emitting active layer 2 of InAlGaP. The active layer 2 can either consist of InAlGaP or contain InAlGaP. In the latter case, the active layer can also contain additional materials. The active layer 2 can be substantially free of any nitride compound semiconductor, e.g., $In_xAl_yGa_{1-x-y}P_uN_{1-u}$ ($0 \leq x \leq 1$, $0 \leq y \leq 1$, $0 \leq x+y \leq 1$ and $0 \leq u < 1$). In one variation of the first implementation, the active layer consists of one or more layers of InAlGaP.

The active layer can be multi-layered, where only portions of the active layer include InAlGaP and/or the InAlGaP composition differs in various parts of the active layer. This also relates to quantum well structures, which shall be explained in more detail below.

Lattice matched confinement layers 3,4 can be located on either side of the active layer 2. At least one of the two confinement layers 3,4 can contain InAlGaPN, BInAlGaPN, or a II-VI semiconductor material, such as ZnMgSSe, ZnMgCdSSe, ZnMgCdTe or ZnMgCdS.

Both confinement layers can contain InAlGaPN, BInAlGaPN, or a II-VI semiconductor material. The confinement layers can have the same composition to obtain a desired charge carrier confinement.

The confinement layers 3, 4 can increase the barrier height with regard to the active layer 2 and, thus, improve the charge carrier confinement. This results in low leakage currents and to an efficient radiation effect.

The confinement layers 3, 4 need not be immediately adjacent to the active layer 2. The distance between confinement layers 3, 4 and active layer 2 can be smaller than the diffusion length of the charge carriers in the active layer. When the distance from the active layer is greater than the diffusion length, the number of charge carriers injected into the active layer decreases. Correspondingly, the effectiveness or efficiency of the confinement layers decreases. The persisting barrier height can then contain only the remaining charge carriers that are injected into the active layer.

Figure 2:
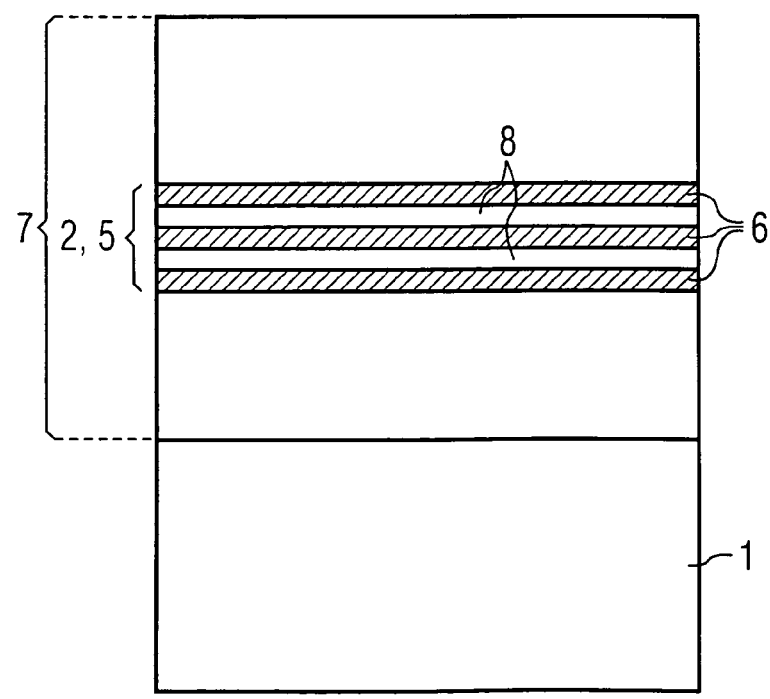
FIG. 2 is a schematic of an example of a semiconductor having an active layer with a quantum well structure.

Referring to FIG. 2, a semiconductor body according to the second implementation described above has a semiconductor body with a substrate 1 on which a series of semiconductor layers 7 is arranged. The series of semiconductor layers 7 comprises a radiation-emitting active layer 2 of InAlGaP. The series of semiconductor layers 7 and can be, for example, a laser structure.

In this second application example, the active layer 2 is designed as a quantum well structure 5 in the form of a double quantum well (DQW) with three barrier layers 6 and two quantum well layers 8 of InAlGaP, each quantum well layer arranged between two barrier layers 6. Pure InAlGaP layers can be used to form the quantum well layers 8. Other quantum well structures can be used, such as simple quantum well structures or multiple quantum well structures with more than two quantum well layers.

The barrier layers 6 can contain InAlGaPN, BInAlGaPN, or a II-VI semiconductor material, such as, ZnMgSSe, ZnMgCdSSe, ZnMgCdTe or ZnMgCdS. This enables greater barrier heights than are typically obtained with standard InAlGaP barrier layers. Greater baffler heights can lead to an improvement of the charge carrier confinement as well as increased efficiency of the radiation effect.

Figure 3:
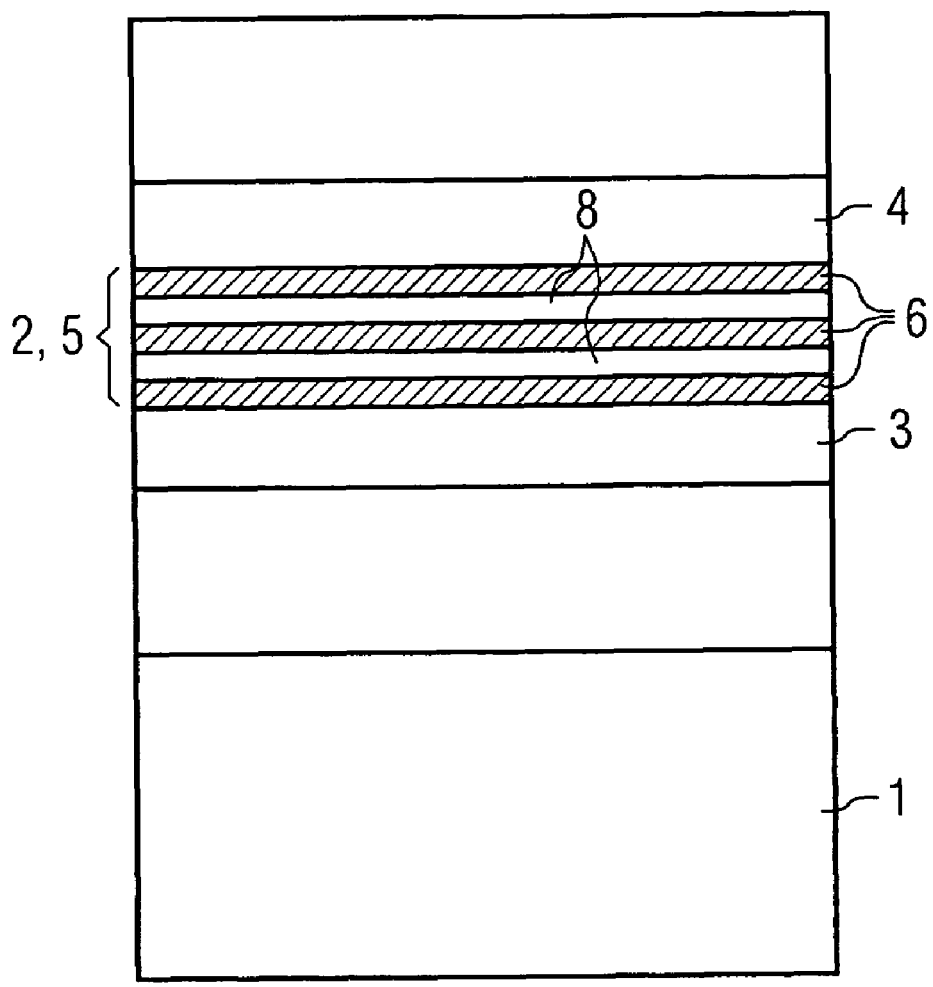
FIG. 3 is a schematic of an example of a semiconductor with an active layer having a quantum well structure confined by confinement layers.

Referring to FIG. 3, a semiconductor body according to the third implementation described above has a semiconductor body with a substrate 1 on which a series of semiconductor layers 7 is arranged. The series of semiconductor layers 7 comprises one or two confinement layers 3, 4 containing InAlGaPN, BInAlGaPN, or a II-VI semiconductor material between which the active InAlGaP layer 2 is arranged. The active layer 2 contains a quantum well structure 5 with barrier layers 6 and quantum well InAlGaP layers 8 arranged between the barrier layers 6. The barrier layers 6 contain InAlGaPN, BInAlGaPN, or a II-VI semiconductor material.

The improved charge carrier confinement, both in the active layer 2 as a whole and in the individual quantum well layers 6, results in a particularly effective construction element.

The barrier heights of the confinement layers 3, 4 do not have to correspond to the barrier heights of the barrier layers 8. If the confinement layers 3,4 and the barrier layers have a different composition, the barrier height of the confinement layers can exceed that of the barrier layers. Thus, a two-fold, staged type of charge carrier confinement can be obtained.

The series of semiconductor layers 7 can contain additional layers. A buffer layer can be arranged between the substrate 1 and the active layer 2 or the first confinement layer. One or more contact layers can be formed on the side of the active layer opposite from the substrate 1. Furthermore, the active layer, or the active layer together with the confinement layers, can be arranged between two coat or cover layers. In a semiconductor laser application, a separate wave guide or optical confinement layers can be arranged on either side of the active layer or on either side of the active layer and the confinement layers, as described above.

In a variation of the above described implementations, a substrate is not used to form the above described semiconductors. In a thin-film construction element, the substrate can be replaced by a series of semiconductor layers. A thin-film construction element can be an element containing a series of semiconductor layers that have been epitaxially grown onto a growth substrate. The growth substrate can be at least in part separate from the series of semiconductor layers. For mechanical stabilization, the series of semiconductor layers can be installed on a carrier.

The semiconductor can be designed as a light emission diode, e.g., as an LED or laser diode. With these elements, a significant increase in efficiency can be achieved. In laser diodes, the charge carrier confinement can decrease the threshold current density.

A number of embodiments of the invention have been described. Nevertheless, it will be understood that various modifications may be made without departing from the spirit and scope of the invention. Accordingly, other embodiments are within the scope of the following claims.

What is claimed is:

1. A radiation-emitting semiconductor, comprising:
a first confinement layer and a second confinement layer;
a radiation-emitting active layer including $In_xAl_yGa_{1-x-y}P$ ($0 \leq x \leq 1$, $0 \leq y \leq 1$, $0 \leq x+y \leq 1$) between the first and second confinement layers, wherein the active layer is formed of a different material than both of the first confinement layer and the second confinement layer;
wherein the first confinement layer is directly on and has the same crystalline orientation as the active layer and the active layer is directly on and has the same crystalline orientation as the second confinement layer; and
wherein the first confinement layer comprises at least one semiconductor material selected from the group consisting of $B_zIn_xAl_yGa_{1-x-y-z}P_uN_{1-u}$ ($0 \leq x \leq 1$, $0 \leq y \leq 1$, $0 < z \leq 1$, $0 \leq x+y+z \leq 1$ and $0 < u < 1$) and a II-VI semiconductor material.

2. The semiconductor of claim 1, wherein the first and second confinement layers are lattice matched to the active layer.

3. The semiconductor of claim 1, wherein the second confinement layer includes one or more of $In_xAl_yGa_{1-x-y}P_uN_{1-u}$ ($0 \leq x \leq 1$, $0 \leq y \leq 1$, $0 \leq x+y \leq 1$ and $0 \leq u < 1$), $B_zIn_xAl_yGa_{1-x-y-z}P_uN_{1-u}$ ($0 \leq x \leq 1$, $0 \leq y \leq 1$, $0 < z \leq 1$, $0 \leq x+y+z \leq 1$ and $0 \leq u < 1$) or a II-VI semiconductor material.

4. The semiconductor of claim 1, wherein the first confinement layer has a first composition and the second confinement layer has the first composition.

5. The semiconductor of claim 1, wherein:
the active layer has a diffusion length for charge carriers injected during operation; and
the first confinement layer is a distance from the active layer that is less than the diffusion length.

6. The semiconductor of claim 1, wherein:
the active layer has a diffusion length for charge carriers injected during operation; and
the first and second confinement layers each are a distance from the active layer that is less than the diffusion length.

7. The semiconductor of claim 1, wherein the II-VI semiconductor material is $Zn_xMg_{1-x}S_ySe_{1-y}$ ($0 \leq x \leq 1$, $0 \leq y \leq 1$).

8. The semiconductor of claim 1, wherein the II-VI semiconductor material includes one or more of the group of semiconductor materials consisting of $Zn_xMg_yCd_{1-x-y}S_uSe_{1-u}$ ($0 \leq x \leq 1$, $0 \leq y \leq 1$, $0 \leq x+y \leq 1$, $0 \leq u \leq 1$), $Zn_xMg_yCd_{1-x-y}Te$ ($0 \leq x \leq 1$, $0 \leq y \leq 1$, $0 \leq x+y \leq 1$), $Zn_xMg_yCd_{1-x-y}Se$ ($0 \leq x \leq 1$, $0 \leq y \leq 1$, $0 \leq x+y \leq 1$) and $Zn_xMg_yCd_{1-x-y}S$ ($0 \leq x \leq 1$, $0 \leq y \leq 1$, $0 \leq x+y \leq 1$).

9. The semiconductor of claim 1, wherein $x>0$, $y>0$ and $x+y<1$.

10. The semiconductor of claim 1, wherein the active layer has a quantum well structure with one or more barrier layers, wherein the one or more barrier layers include $In_xAl_yGa_{1-x-y}P_uN_{1-u}$ ($0 \leq x \leq 1$, $0 \leq y \leq 1$, $0 \leq x+y \leq 1$ and $0 \leq u < 1$), $B_zIn_xAl_yGa_{1-x-y-z}P_uN_{1-u}$ ($0 \leq x \leq 1$, $0 \leq y \leq 1$, $0 < z \leq 1$, $0 \leq x+y+z \leq 1$, $0 \leq u < 1$) or a II-VI semiconductor material.

11. A radiation-emitting semiconductor, comprising:
a radiation-emitting active layer including at least one quantum well layer of $In_xAl_yGa_{1-x-y}P$ ($0 \leq x \leq 1$, $0 \leq y \leq 1$, $0 \leq x+y \leq 1$) with a quantum well structure having one or more barrier layers, wherein the two or more barrier layers include $B_zIn_xAl_yGa_{1-x-y-z}P_uN_{1-u}$ ($0 \leq x \leq 1$, $0 \leq y \leq 1$, $0 < z \leq 1$, $0 \leq x+y+z \leq 1$, $0 < u < 1$) or a II-VI semiconductor material wherein the active layer is formed of a different material than both of the barrier layers, the quantum well layer is between the barrier layers and the barrier layers and quantum well layer are directly on one another and have the same crystalline orientation as one another.

12. The semiconductor of claim 11, wherein the two or more barrier layers include at least a first barrier layer and a second barrier layer and the first barrier layer has a first composition and the second barrier layer has the first composition.

13. The semiconductor of claim 11, wherein the II-VI semiconductor material is $Zn_xMg_{1-x}S_ySe_{1-y}$ ($0 \leq x \leq 1$, $0 \leq y \leq 1$).

14. The semiconductor of claim 11, wherein the II-VI semiconductor material is one of the group of semiconductor materials consisting of $Zn_xMg_yCd_{1-x-y}S_uSe_{1-u}$ ($0 \leq x \leq 1$, $0 \leq y \leq 1$, $0 \leq x+y \leq 1$, $0 \leq u \leq 1$), $Zn_xMg_yCd_{1-x-y}Te$ ($0 \leq x \leq 1$, $0 \leq y \leq 1$, $0 \leq x+y \leq 1$), $Zn_xMg_yCd_{1-x-y}Se$ ($0 \leq x \leq 1$, $0 \leq y \leq 1$, $0 \leq x+y \leq 1$) and $Zn_xMg_yCd_{1-x-y}S$ ($0 \leq x \leq 1$, $0 \leq y \leq 1$, $0 \leq x+y \leq 1$).

15. The semiconductor of claim 11, wherein x>0, y>0 and x+y<1.

16. The semiconductor of claim 11, wherein the active layer has a diffusion length for charge carriers injected during operation, the semiconductor further comprising:
   first and second confinement layers at a distance from the active layer that is less than the diffusion length.

17. A method of making the radiation-emitting semiconductor of claim 1, comprising forming a first confinement layer and a second confinement layer and a radiation-emitting active layer including $In_xAl_yGa_{1-x-y}P$ ($0 \leq x \leq 1$, $0 \leq y \leq 1$, $0 \leq x+y \leq 1$) between the first and second confinement layers, wherein forming the active layer including forming the active layer of a different material than both of the first confinement layer and the second confinement layer, wherein forming the first confinement layer includes forming the first confinement layer directly on and with the same crystalline orientation as the active layer and forming the active layer includes forming the active layer directly on and with the same crystalline orientation as the second confinement layer, wherein the first confinement layer comprises at least one semiconductor material selected from the group consisting of $B_zIn_xAl_yGa_{1-x-y-z}P_uN_{1-u}$ ($0 \leq x \leq 1$, $0 \leq y \leq 1$, $0 < z \leq 1$, $0 \leq x+y+z \leq 1$ and $0 < u < 1$) and a II-VI semiconductor material.

18. The method of claim 17, comprising forming the radiation-emitting active layer including $In_xAl_yGa_{1-x-y}P$ ($0 \leq x \leq 1$, $0 \leq y \leq 1$, $0 \leq x+y \leq 1$) with a quantum well structure having one or more barrier layers, wherein the one or more barrier layers include $In_xAl_yGa_{1-x-y}P_uN_{1-u}$ ($0 \leq x \leq 1$, $0 \leq y \leq 1$, $0 \leq x+y \leq 1$ and $0 \leq u < 1$), $B_zIn_xAl_yGa_{1-x-y-z}P_uN_{1-u}$ ($0 \leq x \leq 1$, $0 \leq y \leq 1$, $0 < z \leq 1$, $0 \leq x+y+z \leq 1$, $0 \leq u < 1$) or a II-VI semiconductor material.

19. The method of claim 17, comprising forming first confinement layer of $Zn_xMg_{1-x}S_ySe_{1-y}$ ($0 \leq x \leq 1$, $0 \leq y \leq 1$).

20. The method of claim 17, comprising forming the first confinement layer of one of the group of II-VI semiconductor materials consisting of $Zn_xMg_yCd_{1-x-y}S_uSe_{1-u}$ ($0 \leq x \leq 1$, $0 \leq y \leq 1$, $0 \leq x+y \leq 1$, $0 \leq u \leq 1$), $Zn_xMg_yCd_{1-x-y}Te$ ($0 \leq x \leq 1$, $0 \leq y \leq 1$, $0 \leq x+y \leq 1$), $Zn_xMg_yCd_{1-x-y}Se$ ($0 \leq x \leq 1$, $0 \leq y \leq 1$, $0 \leq x+y \leq 1$) and $Zn_xMg_yCd_{1-x-y}S$ ($0 \leq x \leq 1$, $0 \leq y \leq 1$, $0 \leq x+y \leq 1$).

21. A method of making the radiation-emitting semiconductor of claim 11 layer, comprising forming a radiation-emitting active layer including at least one quantum well layer of $In_xAl_yGa_{1-x-y}P$ ($0 \leq x \leq 1$, $0 \leq y \leq 1$, $0 \leq x+y \leq 1$) and forming a quantum well structure having two or more barrier layers, wherein the two or more barrier layers include $B_zIn_xAl_yGa_{1-x-y-z}P_uN_{1-u}$ ($0 \leq x \leq 1$, $0 \leq y \leq 1$, $0 < z \leq 1$, $0 \leq x+y+z \leq 1$, $0 < u < 1$) or a II-VI semiconductor material, wherein forming the active layer includes forming the active layer of a different material than both of the barrier layers, forming the quantum well layer between the barrier layers and forming the barrier layers and quantum well layer directly on one another and with the same crystalline orientation as one another.

22. The method of claim 21, comprising forming the one or more barrier layers of $Zn_xMg_{1-x}S_ySe_{1-y}$ ($0 \leq x \leq 1$, $0 \leq y \leq 1$).

23. The method of claim 21, comprising forming the one or more barrier layers of one of the group of II-VI semiconductor materials consisting of $Zn_xMg_yCd_{1-x-y}S_uSe_{1-u}$ ($0 \leq x \leq 1$, $0 \leq y \leq 1$, $0 \leq x+y \leq 1$, $0 \leq u \leq 1$), $Zn_xMg_yCd_{1-x-y}Te$ ($0 \leq x \leq 1$, $0 \leq y \leq 1$, $0 \leq x+y \leq 1$), $Zn_xMg_yCd_{1-x-y}Se$ ($0 \leq x \leq 1$, $0 \leq y \leq 1$, $0 \leq x+y \leq 1$) and $Zn_xMg_yCd_{1-x-y}S$ ($0 \leq x \leq 1$, $0 \leq y \leq 1$, $0 \leq x+y \leq 1$).

24. A radiation-emitting semiconductor, comprising:
   a substrate;
   a first confinement layer on the substrate, wherein the first confinement layer comprises a II-VI semiconductor material;
   a radiation-emitting active layer including $In_xAl_yGa_{1-x-y}P$ ($0 \leq x \leq 1$, $0 \leq y \leq 1$, $0 \leq x+y \leq 1$) on the first confinement layer; and
   a second confinement layer on the radiation-emitting active layer;
   wherein the first confinement layer is directly on and has the same crystalline orientation as the active layer and the active layer is directly on and has the same crystalline orientation as the second confinement layer.

25. A radiation-emitting semiconductor, comprising:
   a first confinement layer and a second confinement layer, wherein the first confinement layer and the second confinement layer comprise a II-VI semiconductor material; and
   a radiation-emitting active layer including $In_xAl_yGa_{1-x-y}P$ ($0 \leq x \leq 1$, $0 \leq y \leq 1$, $0 \leq x+y \leq 1$) between the first and second confinement layers;
   wherein the first confinement layer is directly on and has the same crystalline orientation as the active layer and the active layer is directly on and has the same crystalline orientation as the second confinement layer.

26. The semiconductor of claim 14, wherein the II-VI semiconductor material is a ternary, quaternary or quinary semiconductor material.

27. The semiconductor of claim 13, wherein the II-VI semiconductor material is a ternary or quaternary semiconductor material.

28. The semiconductor of claim 8, wherein the II-VI semiconductor material is a ternary, quaternary or quinary semiconductor material.

29. The semiconductor of claim 7, wherein the II-VI semiconductor material is a ternary, quaternary or quinary semiconductor material.

* * * * *